(12) United States Patent
Ovchinnikov et al.

(10) Patent No.: US 7,624,334 B2
(45) Date of Patent: Nov. 24, 2009

(54) CONSTRUCTION AND USE OF SHORTENED EG-LDPC CODES

(75) Inventors: Andrei Ovchinnikov, St. Petersburg (RU); Evguenii Krouk, St. Petersburg (RU)

(73) Assignee: Intel Corporation, Santa Clara, CA (US)

( * ) Notice: Subject to any disclaimer, the term of this patent is extended or adjusted under 35 U.S.C. 154(b) by 572 days.

(21) Appl. No.: 10/572,116

(22) PCT Filed: Sep. 7, 2005

(86) PCT No.: PCT/RU2005/000461

§ 371 (c)(1),
(2), (4) Date: Mar. 16, 2006

(87) PCT Pub. No.: WO2007/030030

PCT Pub. Date: Mar. 15, 2007

(65) Prior Publication Data

US 2008/0250304 A1 Oct. 9, 2008

(51) Int. Cl.
*G06F 11/00* (2006.01)
(52) U.S. Cl. .................................................. 714/800
(58) Field of Classification Search .............. 714/746, 714/760, 786, 800
See application file for complete search history.

(56) References Cited

U.S. PATENT DOCUMENTS 7,103,825 B2 * 9/2006 Yedidia et al. .............. 714/760

OTHER PUBLICATIONS

Hain-ning et al., LDPC based differential unitary space frequency MIMO-OFDM systems, Sep. 21, 2004, Journal of Zhejiang University Science, (Spring Lake), p. 607-612.*
Lan et al. Construction of structured LDPC codes for AWGN and binary erasure channels, 2005, IEEE, p. 146-151.*
Wang et al., Low complexity, High speed decder architecture for quasic cyclic LDPC codes, 2005, IEEE, p. 5786-5789.*
Kou, Y. , et al., "Low Density Parity Check Codes: Construction Based on Finite Geometries", *Globecom' 00. 2000 IEEE Global Telecommunications Conference*; 2 of 4, (Nov. 27, 2000),825-829.
Kou, Y. , et al., "Low-density parity-check codes based on finite geometries: A rediscovery and new results", *IEEE Transactions on Information Theory*; 47(7), (Nov. 2001),2711-2736.
Lin, S. , et al., "Error Control Coding: Fundamentals and Applications", *Finite Geometry Codes*, (1983),233-256.
Djurdjevic, Ivana , "A Class of Low-Density Parity-Check Codes Constructed Based on Reed-Solomon Codes With Two Information Symbols", *IEEE Communication Letters*, vol. 7, No. 7, (2003),317-319.
Fossorier, Marc , et al., "Reduced Complexity Iterative Decoding of Low Density Parity Check Codes Based on Belief Propagation", *IEEE Transactions on Communications*, (1998),21.

* cited by examiner

*Primary Examiner*—Shelly A Chase
(74) *Attorney, Agent, or Firm*—The Law Offices of John C. Scott, LLC; John C. Scott

(57) ABSTRACT

Code shortening techniques are used to achieve a variety of code lengths and code rates for Euclidean geometry low density parity check (EG-LDPC) codes.

16 Claims, 7 Drawing Sheets

| | 32 | | | |
|---|---|---|---|---|
| 1000 | 0010 | 0001 | 0010 | 0010 |
| 1000 | 1000 | 1000 | 1000 | 1000 |
| 0100 | 0010 | 0100 | 0100 | 1000 |
| 0100 | 0001 | 0001 | 1000 | 0100 |
| 0010 | 0001 | 0010 | 0010 | 1000 |
| 0100 | 1000 | 0010 | 0001 | 0010 |
| 1000 | 0001 | 0100 | 0001 | 0001 |
| 0001 | 0010 | 0010 | 1000 | 0001 |
| 0001 | 0100 | 0001 | 0001 | 1000 |
| 0100 | 0100 | 1000 | 0010 | 0001 |
| 0001 | 0001 | 1000 | 0100 | 0010 |
| 1000 | 0100 | 0010 | 0100 | 0100 |
| 0010 | 0010 | 1000 | 0001 | 0100 |
| 0010 | 1000 | 0001 | 0100 | 0001 |
| 0001 | 1000 | 0100 | 0010 | 0100 |
| 0010 | 0100 | 0100 | 1000 | 0010 |
| 22 $P_1$ | 24 $P_2$ | 26 $P_3$ | 28 $P_4$ | 30 $P_5$ |

CONSTRUCTION AND USE OF SHORTENED EG-LDPC CODES

TECHNICAL FIELD

The invention relates generally to forward error correction codes and, more particularly, to low density parity check (LDPC) codes.

BACKGROUND OF THE INVENTION

Low density parity check (LDPC) codes are increasing in popularity for use in wireless communication systems and in other contexts. LDPC codes are capable of achieving good error performance with a relatively low complexity decoding process. However, LDPC codes are known for having a relatively low minimal distance that limits their performance. One type of LDPC code that is based on the finite Euclidean geometry is known as the EG-LDPC code. EG-LDPC codes typically have minimal distances that are higher than most other types of LDPC codes. However, the finite Euclidean geometries that are used with such codes have been known to limit the range of code lengths and code rates that may be achieved. In some coding applications, it may be desirable to have more flexibility in the code lengths and rates that are achievable.

BRIEF DESCRIPTION OF THE DRAWINGS

FIG. 2 is a diagram illustrating an example parity check matrix for an EG-LDPC code from geometry EG(2, $2^2$) that has had its columns rearranged into parallel classes in accordance with an embodiment of the present invention;

DETAILED DESCRIPTION

Figure 1:
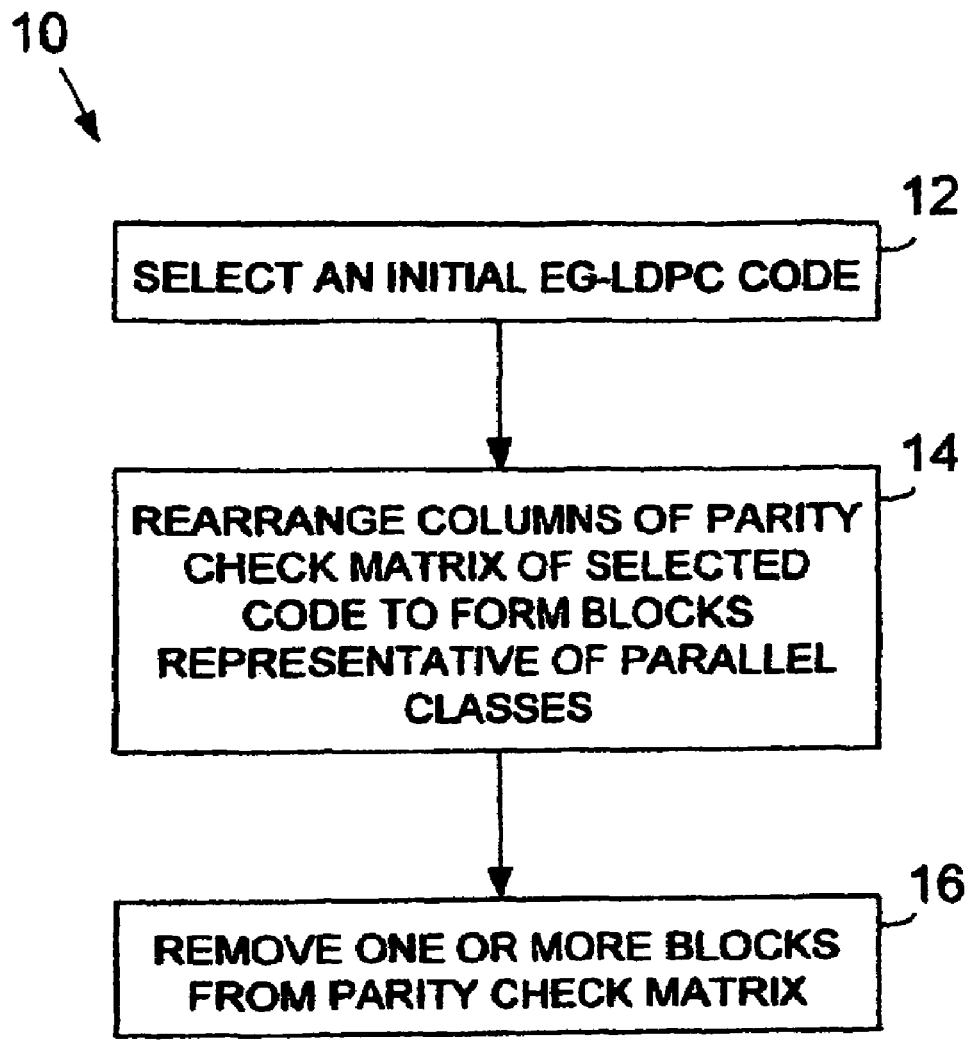
FIG. 1 is a flowchart illustrating an example method for use in generating a shortened EG-LDPC code in accordance with an embodiment of the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention relates to techniques for achieving a broader range of code rates and lengths in Euclidean geometry low density parity check (EG-LDPC) codes than were available in the past. This may be achieved by using novel code shortening techniques to shorten a full geometry EG-LDPC code. Code shortening techniques have been used in the past as a method for achieving new codes from existing codes. However, LDPC code shortening can negatively impact the performance of the existing code. In at least one embodiment of the present invention, code shortening techniques are provided for use with EG-LDPC codes that do not reduce (or only slightly reduce) the overall performance of the underlying codes.

A finite geometry is a combinatorial object consisting of a number of lines and points. Euclidean finite geometry is a finite geometry that is defined by a number of axioms. A Euclidean finite geometry can be represented as the finite Galois field GF($q^m$), where q=$p^s$ and p is a prime number. The elements of GF($q^m$) are geometry points and lines may be obtained from the equation of the line as linear combinations of points. The parameter m is the "dimension" of the geometry. The parameters p, s, and m define the points and lines of the geometry.

FIG. 1 is a flowchart illustrating an example method 10 for use in generating a shortened EG-LDPC code in accordance with an embodiment of the present invention. First, an initial EG-LDPC code is selected that utilizes the whole Euclidean geometry of interest (i.e., EG(m,$p^s$)) (block 12). The initial EG-LDPC code may be represented by a parity check matrix having a number of columns that is equal to the number of lines in the corresponding Euclidean geometry. The columns of the parity check matrix associated with the initial EG-LDPC code are then rearranged into a plurality of blocks that are each representative of a parallel class (block 14). Each column within a parallel class has no points in common with the other columns in the parallel class. One of the blocks is then removed from the parity check matrix to define a new, shortened EG-LDPC code (block 16). The new EG-LDPC code is a regular LDPC code with the same column weight as the original code and a row weight that is decreased by one. The removal of a block preserves the regular structure of the code since each row within the block includes exactly one non-zero entry.

The code may then be shortened further by eliminating one or more additional blocks from the parity check matrix. The shortening of the code on k parallel classes results in a code having a lower rate and a lower length than the original code (where k is a positive integer). This process may thus be used as a flexible tool to manage the code parameters. The process will typically result in the exclusion of some codewords of small weight from the initial code, thus improving the weight spectrum of the EG-LDPC code. Any number of blocks may be removed to develop a new code, as long as the resulting code is capable of achieving adequate performance. For example, in one implementation, a shortened code is developed by removing 10 (or more) parallel classes from an initial code. In another implementation, a shortened code is developed by removing 20 (or more) parallel classes from an initial code.

FIG. 2 is a diagram illustrating an example parity check matrix 20 for an EG-LDPC code from geometry EG(2, $2^2$) that has had its columns rearranged into parallel classes in accordance with an embodiment of the present invention. As shown, the parity check matrix 20 is organized into 5 parallel classes 22, 24, 26, 28, 30 ($P_1$, $P_2$, $P_3$, $P_4$, $P_5$) that each have four columns/lines. Each column within each of the parallel classes has no points in common with the other columns of the parallel class. To achieve a new shortened code, one or more of the parallel classes is removed from the parity check matrix 20. For example, in one possible implementation, the first parallel class 22 may be removed from the parity check matrix 20 to achieve a new parity check matrix 32 having a shorter code length and a higher rate. Additional parallel classes may also be removed. It is always possible to divide columns into parallel classes for a Euclidean geometry LDPC code.

Figure 3:
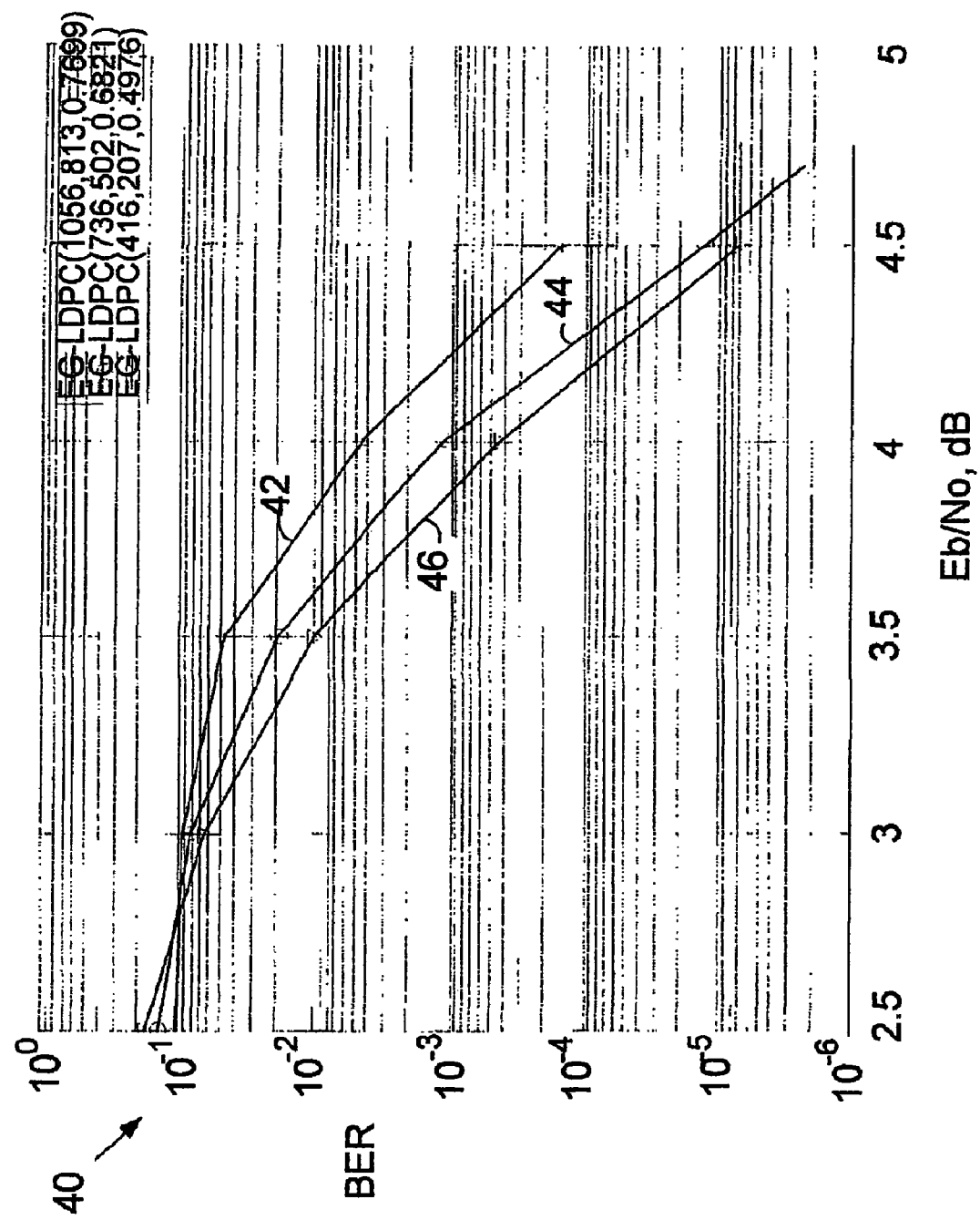
FIG. 3 is a graph illustrating the results of a simulation showing the effect of code shortening on bit error rate (BER) performance in accordance with an embodiment of the present invention.

FIG. 3 is a graph 40 illustrating the results of a simulation showing the effect of code shortening on bit error rate (BER) performance in an additive white Gaussian noise (AWGN) channel using binary phase shift keying (BPSK) in accordance with an embodiment of the present invention. The code that is used in the simulation is from geometry EG($2,2^5$). A first plot 42 illustrates the BER to $E_b/N_0$ curve for an EG-LDPC(1056,813,0.7699) code that uses the full geometry. A second plot 44 illustrates the BER to $E_b/N_0$ curve for an EG-LDPC(736,502,0.6821) code that is a shortened version of the initial code (shortened by 10 parallel classes). A third plot 46 illustrates the BER to $E_b/N_0$ curve for an EG-LDPC (416,207,0.4976) code that is also a shortened version of the initial code (shortened by 20 parallel classes). As illustrated by graph 40 of FIG. 3, the shortened codes represented by plots 44 and 46 achieve better BER performance (e.g., a lower error rate for a given $E_b/N_0$ value) than the full geometry code of plot 42.

Figure 4:
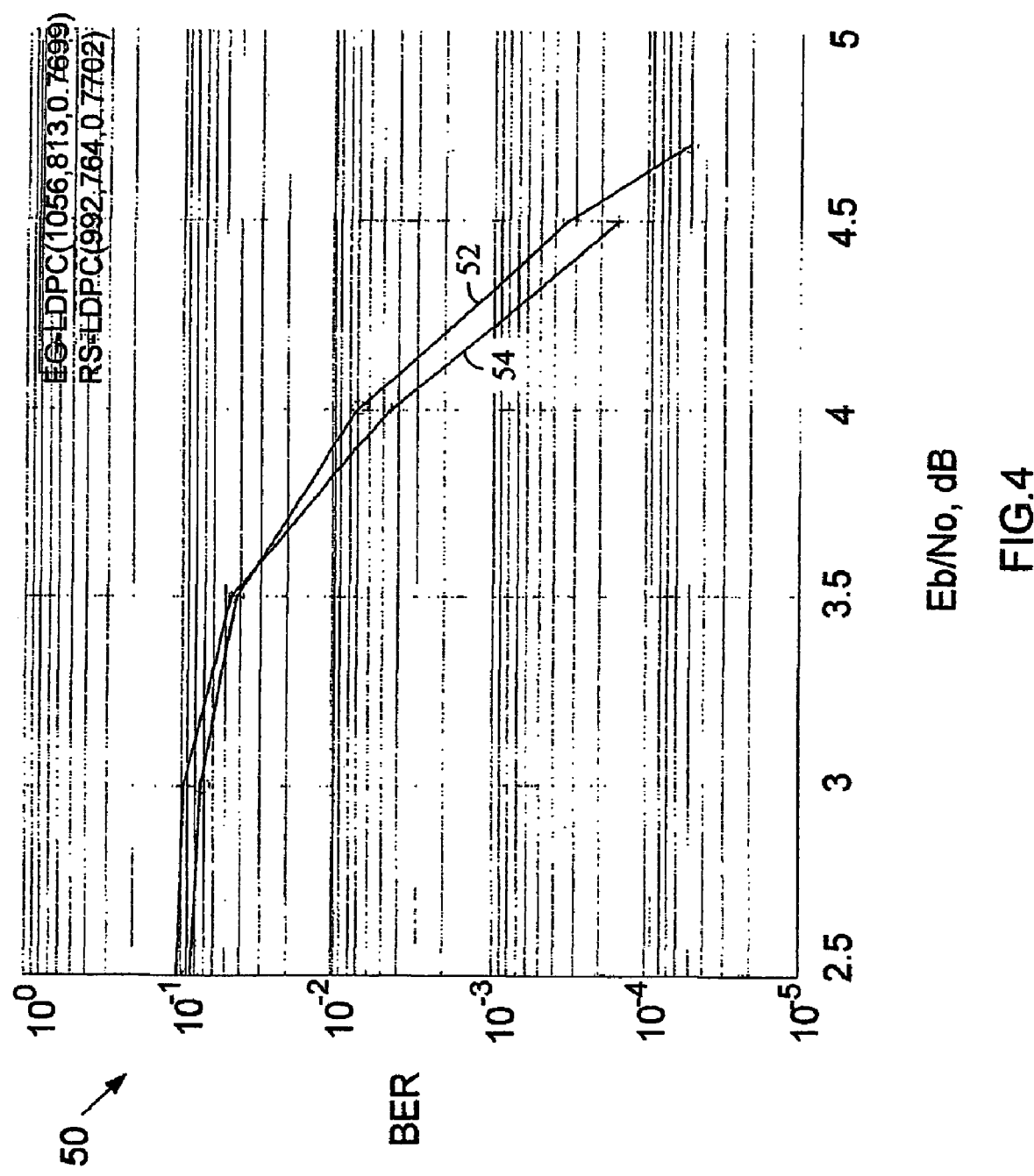
FIGS. 4-6 are graphs comparing the BER performance of a shortened EG-LDPC code to the performance of an LDPC code based on a shortened Reed-Solomon code (RS-LDPC) in accordance with an embodiment of the present invention.
Figure 5:
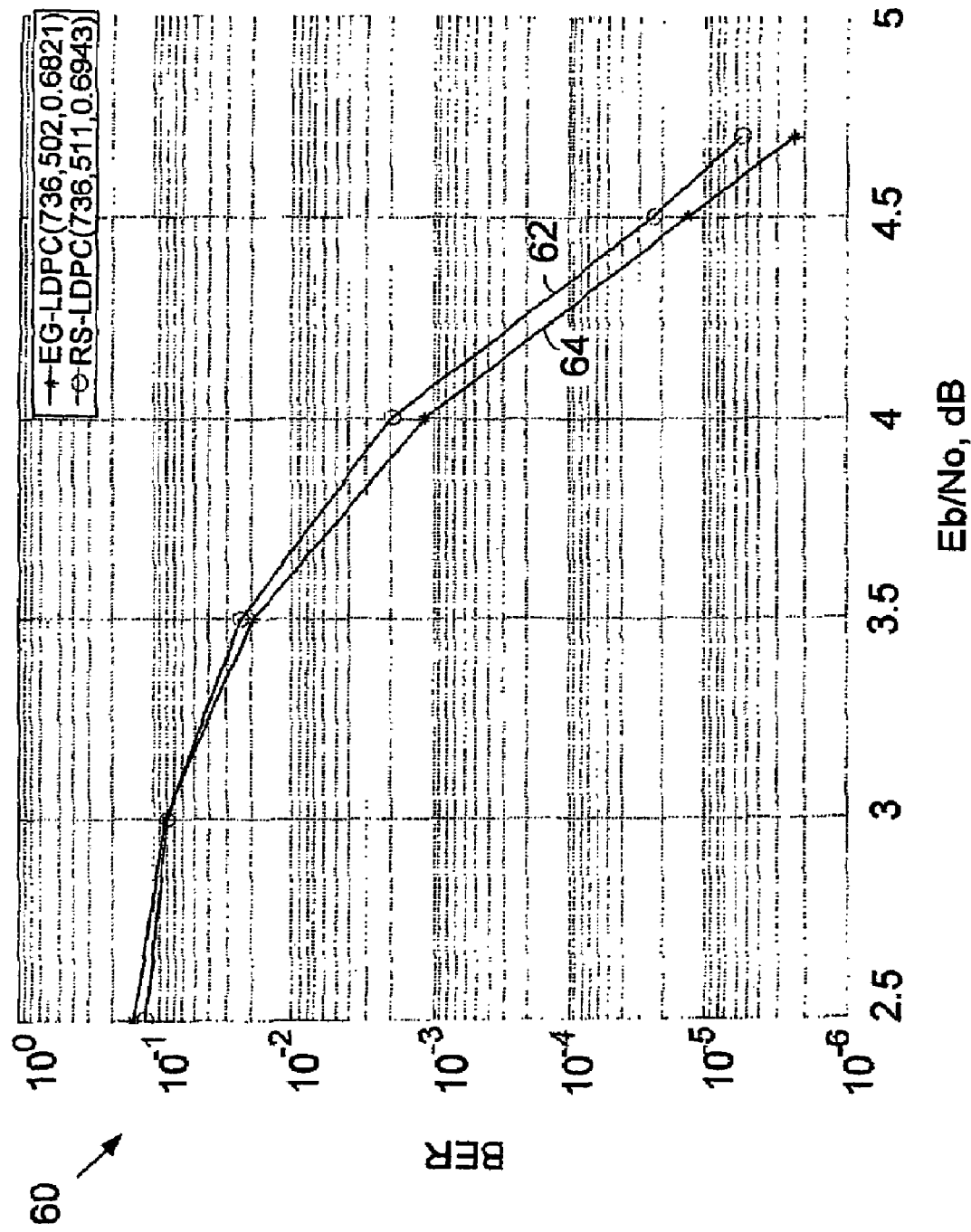
Figure 6:
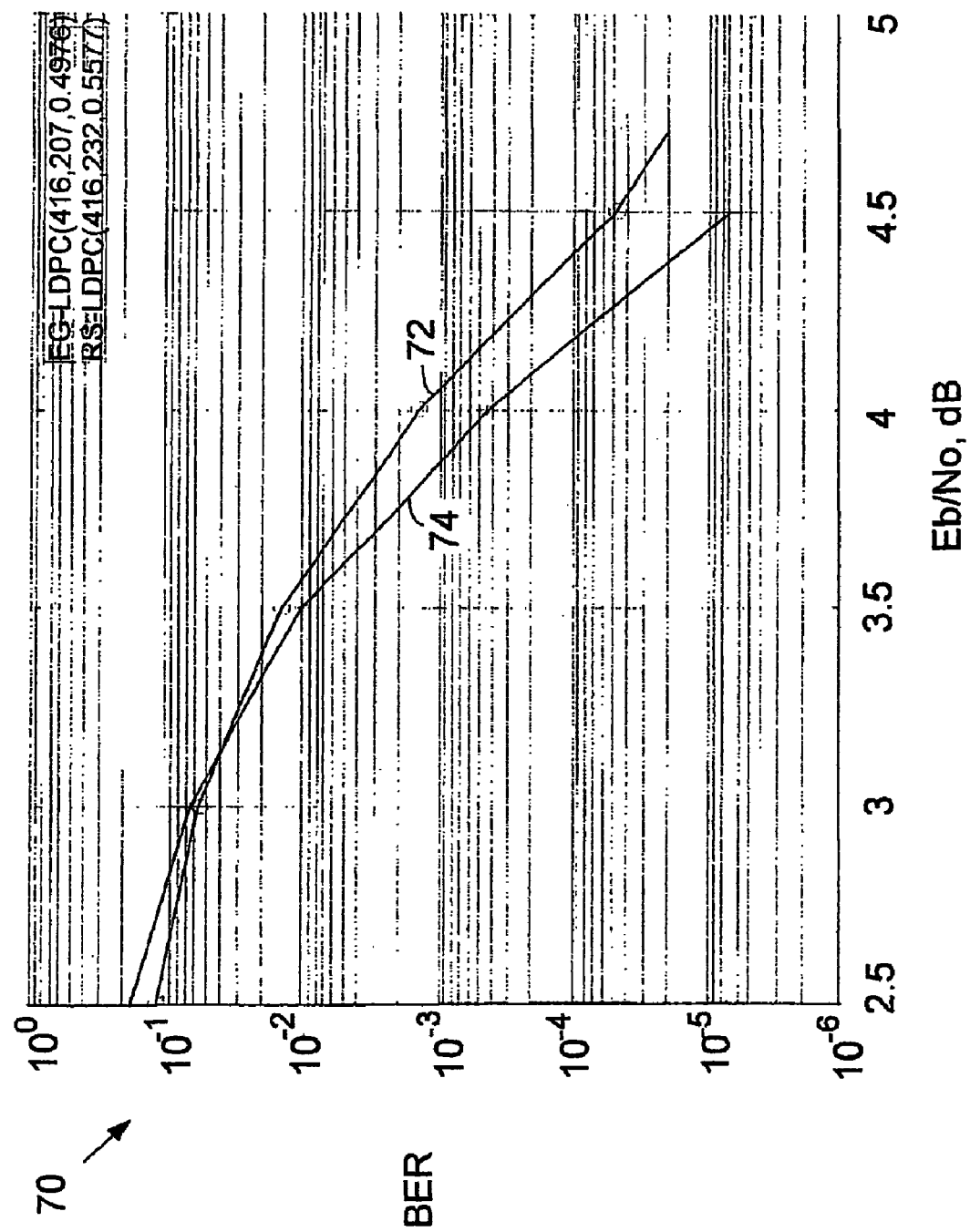

FIGS. 4-6 are graphs comparing the BER performance of a shortened EG-LDPC code to the performance of an LDPC code based on a shortened Reed-Solomon code (RS-LDPC) in accordance with an embodiment of the present invention. The simulations were made using a UMP (uniformly most powerful) decoder with a maximum number of iterations equal to 10. The graphs of FIGS. 4-6 show that EG-LDPC codes generated using the inventive techniques are capable of achieving the same or better performance as other known good constructions having similar code parameters (e.g., length and rate). Thus, the shortening techniques of the present invention may be used to achieve a wider range of lengths and rates for LDPC codes without sacrificing performance.

FIG. 4 is a graph 50 comparing the performance of the initial full geometry EG-LDPC(1056,813,0.7699) code discussed previously to the performance of an RS-LDPC(992, 764,0.7702) code having a similar code length and rate. Plot 54 is the BER to $E_b/N_0$ curve for the EG-LDPC(1056,813, 0.7699) code and plot 52 is the BER to $E_b/N_0$ curve for the RS-LDPC(992,764,0.7702) code. FIG. 5 is a graph 60 comparing the performance of the shortened EG-LDPC(736,502, 0.6821) code discussed previously to the performance of a shortened RS-LDPC(736,511,0.6943) code having a similar code length and rate. As described previously, the EG-LDPC (736,502,0.6821) code is a shortened version of the EG-LDPC(1056,813,0.7699) code that has been shortened by 10 parallel classes. Plot 64 is the BER to $E_b/N_0$ curve for the shortened EG-LDPC(736,502,0.6821) code and plot 62 is the BER to $E_b/N_0$ curve for the shortened RS-LDPC(736,511, 0.6943) code. FIG. 6 is a graph 70 comparing the performance of the shortened EG-LDPC(416,207,0.4976) code discussed previously to the performance of a shortened RS-LDPC(416,232,0.5577) code having a similar code length and rate. As described previously, the EG-LDPC(416, 207,0.4976) code is a shortened version of the EG-LDPC (1056,813,0.7699) code that has been shortened by 20 parallel classes. Plot 74 is the BER to $E_b/N_0$ curve for the shortened EG-LDPC(416,207,0.4976) code and plot 72 is the BER to $E_b/N_0$ curve for the shortened RS-LDPC(416,232,0.5577) code. As shown in FIGS. 5 and 6, the shortened EG-LDPC codes achieve slightly better performance than the corresponding RS-LDPC codes.

In at least one embodiment of the present invention, a communication device is provided that is adapted to use a shortened EG-LDPC code constructed as described above. The communication device may be a wired device or a wireless device. The communication device may include an encoder within a transmit chain of the device that is capable of encoding a bit stream using the shortened EG-LDPC code. The communication device may also (or alternatively) include a decoder within a receive chain of the device that is capable of decoding a bit stream using the shortened EG-LDPC code.

Figure 7:
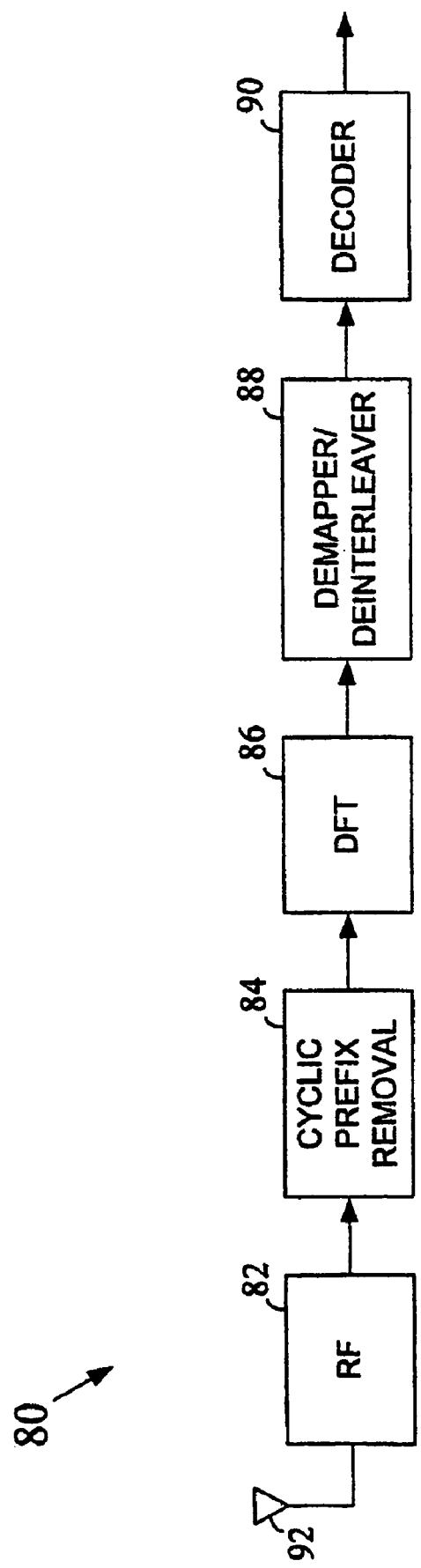
FIG. 7 is a block diagram illustrating an example receive chain that may be used within a wireless device in accordance with an embodiment of the present invention.

FIG. 7 is a block diagram illustrating an example receive chain 80 that may be used within a wireless device in accordance with an embodiment of the present invention. The receive chain 80 is for use in a communication system or network implementing orthogonal frequency division multiplexing (OFDM). As shown, the receive chain 80 includes: a radio frequency (RF) block 82, a cyclic prefix removal block 84, a discrete Fourier transform (DFT) 86, a demapper/ deinterleaver 88, and a decoder 90. The receive chain 80 may be coupled to one or more antennas 92 to facilitate the reception of signals from the wireless channel. Any type of antenna(s) may be used including, for example, a dipole, a patch, a helical antenna, an antenna array, and/or others.

The RF block 82 is operative for performing the processing necessary to convert a received signal from RF to baseband. The RF block 82 may include elements such as, for example, a low noise amplifier, elements for performing frequency down conversion, one or more RF and/or IF filters, elements for performing I/Q demodulation, an analog to digital converter, and/or other elements. Some or all of these RF functions may also be performed digitally. The cyclic prefix removal block 84 is operative for removing a cyclic prefix from a received OFDM symbol output by the RF block 82. The DFT unit 86 is operative for converting the received OFDM symbol from a time domain representation to a frequency domain representation. The DFT unit 86 outputs a number of samples that each correspond to a subcarrier of the multicarrier OFDM symbol and each includes a corresponding data symbol. The demapper/deinterleaver 88 demaps the data symbols output by the DFT 86 into data bits based on one or more predetermined modulation schemes. The demapper/ deinterleaver 88 may then deinterleave the bits into a stream for delivery to the decoder 90. The decoder 90 decodes the bit stream based on a predetermined FEC coding scheme. In at least one embodiment of the present invention, the decoder 90 is adapted to decode data encoded with a shortened EG-LDPC code that was constructed in accordance with the present invention. Any type of decoder that is capable of decoding EG-LDPC codes may be used including, for example, majority logic decoders, belief propagation decoders, and/or others. Techniques for designing a decoder to decode a predetermined code are well known in the art.

It should be appreciated that the receive chain 80 of FIG. 7 is merely an example of one type of receive chain that may include a decoder to decode data encoded using a shortened EG-LDPC coded in accordance with the present invention. Other types of receiver, including non-OFDM receivers, may also implement such a decoder. In addition, such decoders may also be used in wired communication applications and in non-communications based applications. The wireless device that includes the receive chain 80 of FIG. 7 may also include a transmit chain having an encoder that is adapted to encode data using a shortened EG-LDPC code constructed in accordance with the present invention. The wireless device may include, for example, a laptop, palmtop, desktop, or tablet computer having wireless capability; a personal digital assistant (PDA) having wireless capability; a cellular telephone or other handheld wireless communicator, a pager, a satellite communicator, a network interface card (NIC) or other network interface structure, an integrated circuit, or some other type of wireless device.

In at least one embodiment of the invention, the process for constructing shortened EG-LDPC codes is implemented as instructions and/or data structures stored on machine readable media. Examples of different types of machine readable media that may be used include floppy diskettes, hard disks, optical disks, compact disc read only memories (CD-ROMs), magneto-optical disks, read only memories (ROMs), random access memories (RAMs), erasable programmable ROMs (EPROMs), electrically erasable programmable ROMs (EE-PROMs), magnetic or optical cards, flash memory, and/or other types of media suitable for storing electronic instructions or data. In at least one form, the invention is embodied as a set of instructions that are modulated onto a carrier wave for transmission over a transmission medium.

It should be appreciated that the individual blocks illustrated in the block diagrams herein may be functional in nature and do not necessarily correspond to discrete hardware elements. For example, in at least one embodiment, two or more of the blocks in a block diagram are implemented in software within a single digital processing device. The digital processing device may include, for example, a general purpose microprocessor, a digital signal processor (DSP), a reduced instruction set computer (RISC), a complex instruction set computer (CISC), a field programmable gate array (FPGA), an application specific integrated circuit (ASIC), and/or others, including combinations of the above. Hardware, software, firmware, and hybrid implementations may be used.

In the foregoing detailed description, various features of the invention are grouped together in one or more individual embodiments for the purpose of streamlining the disclosure. This method of disclosure is not to be interpreted as reflecting an intention that the claimed invention requires more features than are expressly recited in each claim. Rather, as the following claims reflect, inventive aspects may lie in less than all features of each disclosed embodiment.

Although the present invention has been described in conjunction with certain embodiments, it is to be understood that modifications and variations may be resorted to without departing from the spirit and scope of the invention as those skilled in the art readily understand. Such modifications and variations are considered to be within the purview and scope of the invention and the appended claims.

What is claimed is:

1. A computer implemented method comprising:
   selecting an initial Euclidean geometry low density parity check (EG-LDPC) code, said initial EG-LDPC code having a parity check matrix;
   rearranging columns of said parity check matrix to form blocks that are each representative of a parallel class of lines, wherein a parallel class of lines is a class where each column has no points in common with the other columns in the class; and
   removing one or more of said blocks from said parity check matrix to form a new shortened EG-LDPC code having a shorter code length and a lower code rate.

2. The method of claim 1, wherein:
   removing includes removing at least 10 blocks.

3. The method of claim 1, wherein:
   removing includes removing at least 20 blocks.

4. The method of claim 1, wherein;
   said new shortened EG-LDPC code has a bit error rate (BER) performance that is superior to a BER performance of said initial EG-LDPC code.

5. The method of claim 1, wherein:
   said new shortened EG-LDPC code has an improved weight spectrum with respect to said initial EG-LDPC code.

6. The method of claim 1, further comprising:
   using said new shortened EG-LDPC code to encode data within a communication device.

7. The method of claim 1, further comprising:
   using said new shortened EG-LDPC code to decode data within a communication device.

8. An article comprising a computer readable storage medium having instructions stored thereon that, when executed by a computing platform, operate to:
   obtain an initial Euclidean geometry low density parity check (EG-LDPC) code, said initial EG-LDPC code having a parity check matrix;
   rearrange columns of said parity check matrix to form blocks that are each representative of a parallel classes of lines, wherein a parallel class of lines is a class where each column has no points in common with the other columns in the class; and
   remove one or more of said blocks from said parity check matrix to form a new shortened EG-LDPC code.

9. The article of claim 8, wherein:
   said new shortened EG-LDPC code has a bit error rate (BER) performance that is superior to a BER performance of said initial EG-LDPC code.

10. The article of claim 8, wherein:
    said new shortened EG-LDPC code has an improved weight spectrum with respect to said initial EG-LDPC code.

11. A device, comprising:
    a decoder that is adapted to decode data received from a remote communication entity that is encoded with a shortened Euclidean geometry low density parity check (EG-LDPC) code, wherein said shortened EG-LDPC code was generated by rearranging columns within a parity check matrix of an initial EG-LDPC code to form blocks that are each representative of a parallel class of lines, wherein a parallel class of lines is a class where each column has no points in common with the other columns in the class, and removing one or more of said blocks from said parity check matrix to form a new parity check matrix representative of said shortened EG-LDPC code.

12. The device of claim 11, wherein:
    said device is a wireless communication device.

13. The communication device of claim 11, wherein:
    said device is an orthogonal frequency division multiplexing (OFDM) based device.

14. A system, comprising:
    a dipole antenna to receive a wireless signal from a wireless channel, said wireless signal including encoded data; and
    a decoder to decode said encoded data, said decoder being adapted to decode a shortened Euclidean geometry low density parity check (EG-LDPC) code, wherein said shortened EG-LDPC code was generated by rearranging columns within a parity check matrix of an initial EG- LDPC code to form blocks that are each representative of a parallel class of lines, wherein a parallel class of lines is a class where each column has no points in common with the other columns in the class, and removing one or more of said blocks from said parity check matrix to form a new parity check matrix representative of said shortened EG-LDPC code.

15. The system of claim 14 wherein:
said system is a communicator for use in a wireless network.

16. The system of claim 14, wherein:
said system is an orthogonal frequency division multiplexing (OFDM) based system.

* * * * *

UNITED STATES PATENT AND TRADEMARK OFFICE
CERTIFICATE OF CORRECTION

PATENT NO. : 7,624,334 B2  Page 1 of 1
APPLICATION NO. : 10/572116
DATED : November 24, 2009
INVENTOR(S) : Ovchinnikov et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 825 days.

Signed and Sealed this

Twenty-sixth Day of October, 2010

David J. Kappos
*Director of the United States Patent and Trademark Office*